United States Patent
Jang et al.

(10) Patent No.: US 11,257,905 B2
(45) Date of Patent: Feb. 22, 2022

(54) SEMICONDUCTOR DEVICE INCLUDING SOURCE/DRAIN REGION

(71) Applicant: SAMSUNG ELECTRONICS CO., LTD., Suwon-si (KR)

(72) Inventors: Sung Uk Jang, Hwaseong-si (KR); Seung Hun Lee, Hwaseong-si (KR); Su Jin Jung, Hwaseong-si (KR); Young Dae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 40 days.

(21) Appl. No.: 16/386,459

(22) Filed: Apr. 17, 2019

(65) Prior Publication Data

US 2020/0152740 A1    May 14, 2020

(30) Foreign Application Priority Data

Nov. 14, 2018    (KR) .......................... 10-2018-0139521

(51) Int. Cl.

| H01L 29/08 | (2006.01) |
|---|---|
| H01L 29/786 | (2006.01) |
| H01L 29/167 | (2006.01) |
| H01L 29/66 | (2006.01) |
| H01L 29/417 | (2006.01) |
| H01L 29/06 | (2006.01) |
| H01L 21/82 | (2006.01) |
| H01L 21/02 | (2006.01) |
| H01L 29/423 | (2006.01) |

(52) U.S. Cl.
CPC ........ *H01L 29/0847* (2013.01); *H01L 29/167* (2013.01); *H01L 29/41733* (2013.01); *H01L 29/42392* (2013.01); *H01L 29/66553* (2013.01); *H01L 29/78696* (2013.01)

(58) Field of Classification Search
CPC .................................................. H01L 29/167
See application file for complete search history.

(56) References Cited

U.S. PATENT DOCUMENTS

| 9,472,669 | B1 | 10/2016 | Chiang et al. |
|---|---|---|---|
| 9,899,387 | B2 | 2/2018 | Ching et al. |
| 2016/0005657 | A1 | 1/2016 | Krishnan et al. |
| 2016/0056238 | A1 | 2/2016 | Lim et al. |
| 2016/0079422 | A1* | 3/2016 | Rachmady ........ H01L 29/66795 257/29 |
| 2016/0276344 | A1* | 9/2016 | Choi ............... H01L 21/823814 |
| 2017/0110542 | A1* | 4/2017 | Lee .................... H01L 29/66439 |
| 2017/0154973 | A1* | 6/2017 | Ching .............. H01L 29/41791 |
| 2017/0338326 | A1 | 11/2017 | Ching et al. |
| 2018/0114834 | A1* | 4/2018 | Cheng ................ H01L 29/0665 |
| 2018/0151698 | A1* | 5/2018 | Sung ................... H01L 29/7848 |

* cited by examiner

*Primary Examiner* — Omar F Mojaddedi
(74) *Attorney, Agent, or Firm* — Lee IP Law, P.C.

(57) ABSTRACT

A semiconductor device including an active region defined in a substrate; at least one channel layer on the active region; a gate electrode intersecting the active region and on the active region and surrounding the at least one channel layer; and a pair of source/drain regions adjacent to both sides of the gate electrode, on the active region, and in contact with the at least one channel layer, wherein the pair of source/drain regions includes a selective epitaxial growth (SEG) layer, and a maximum width of each of the pair of source/drain regions in a first direction is 1.3 times or less a width of the active region in the first direction.

20 Claims, 12 Drawing Sheets

SEMICONDUCTOR DEVICE INCLUDING SOURCE/DRAIN REGION

CROSS-REFERENCE TO RELATED APPLICATION

Korean Patent Application No. 10-2018-0139521, filed on Nov. 14, 2018, in the Korean Intellectual Property Office (KIPO), and entitled: "Semiconductor Device Including Source/Drain Region," is incorporated by reference herein in its entirety.

BACKGROUND

1. Field

Embodiments relate to a semiconductor device having a source/drain region.

2. Description of the Related Art

A technique of forming source/drain regions using a selective epitaxial growth (SEG) layer may help improve characteristics of a transistor.

SUMMARY

The embodiments may be realized by providing a semiconductor device including an active region defined in a substrate; at least one channel layer on the active region; a gate electrode intersecting the active region and on the active region and surrounding the at least one channel layer; and a pair of source/drain regions adjacent to both sides of the gate electrode, on the active region, and in contact with the at least one channel layer, wherein the pair of source/drain regions includes a selective epitaxial growth (SEG) layer, and a maximum width of each of the pair of source/drain regions in a first direction is 1.3 times or less a width of the active region in the first direction.

The embodiments may be realized by providing a semiconductor device including an active region defined in a substrate; at least one channel layer on the active region and having P-type impurities; a gate electrode intersecting the active region on the active region and surrounding the at least one channel layer; and a pair of source/drain regions adjacent to both sides of the gate electrode, on the active region, and in contact with the at least one channel layer, wherein the pair of source/drain regions include a selective epitaxial growth (SEG) layer having N-type impurities, and a maximum width of each of the pair of source/drain regions in a first direction is 1.3 times or less a width of the active region in the first direction.

The embodiments may be realized by providing a semiconductor device including first and second active regions defined in a substrate and spaced apart from each other; and first and second source/drain regions on the first and second active regions and spaced apart from each other, wherein the first and second source/drain regions include a selective epitaxial growth (SEG) layer, and a maximum width of each of the first and second source/drain regions in a first direction is 1.3 times or less a width of a corresponding one of the first and second active regions in the first direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
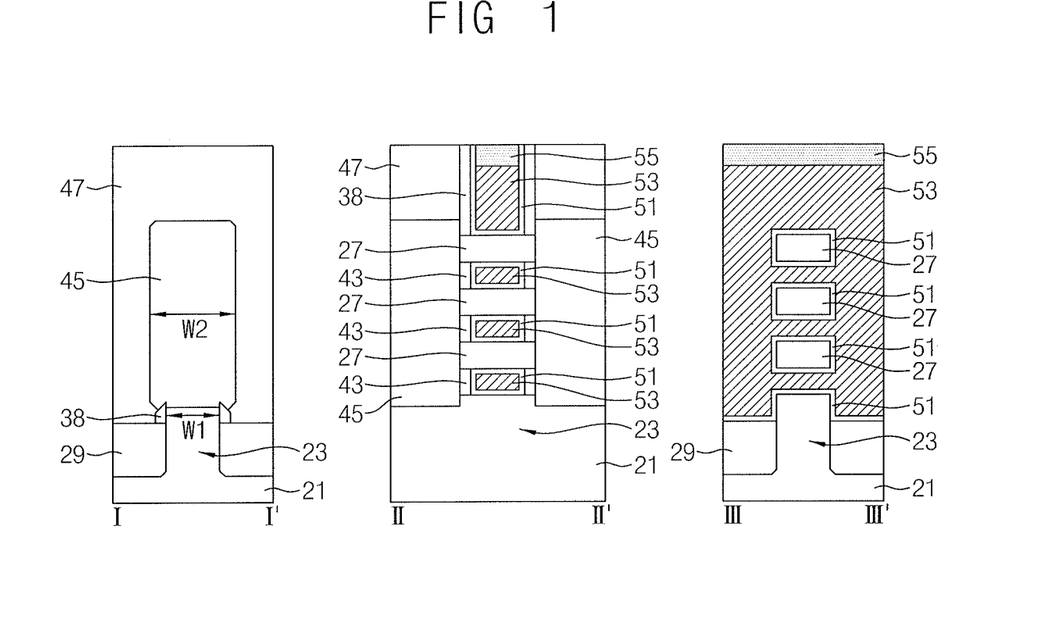
FIG. 1 illustrates a cross-sectional view of a semiconductor device according to an embodiment.
Figure 2:
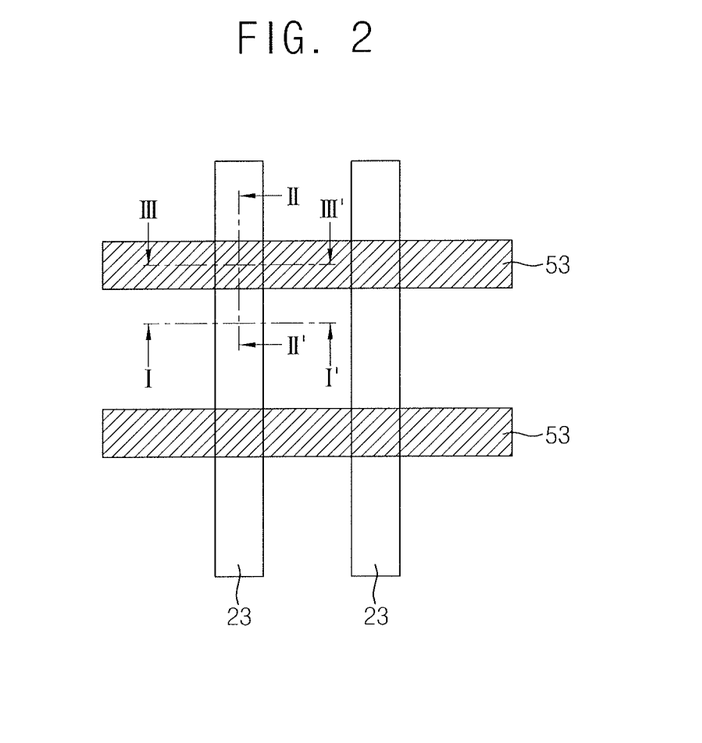
FIG. 2 illustrates a layout view of a semiconductor device according to an embodiment.

FIG. 1 illustrates a cross-sectional view of a semiconductor device according to an embodiment. FIG. 2 illustrates a layout view a semiconductor device according to an embodiment. FIG. 1 includes cross-sectional views taken along lines IT, and III-III' of FIG. 2. In an implementation, the semiconductor device may include a multi-bridge channel (MBC) transistor, a nano-sheet transistor, or a gate-all-around (GAA) transistor.

Referring to FIG. 1, the semiconductor device according to an embodiment may include a substrate 21, an active region 23, at least one channel layer 27, a device isolation layer 29, a sidewall spacer 38, a plurality of inner spacers 43, a pair of source/drain regions 45, an interlayer insulating layer 47, a gate dielectric layer 51, a gate electrode 53, and a gate capping pattern 55. The at least one channel layer 27 may include a plurality of channel layers 27.

Referring to FIG. 2, a plurality of active regions 23 may be provided in parallel to each other. A plurality of gate electrodes 53 may be provided in parallel to each other. Each of the plurality of gate electrodes 53 may intersect the plurality of active regions 23.

Referring again to FIGS. 1 and 2, the device isolation layer 29 may be in the substrate 21. The active region 23 may be defined by the device isolation layer 29 in the substrate 21. A top surface of the device isolation layer 29 may be recessed at a lower level than an upper end of the active region 23. The plurality of channel layers 27 may be sequentially stacked on the active region 23 in a vertical direction (e.g., away from the substrate 21). The plurality of channel layers 27 may be spaced apart from the active region 23. The plurality of channel layers 27 may be spaced apart from each other.

The gate electrode 53 may intersect the active region 23 on the active region 23 and may surround the plurality of channel layers 27. The gate electrode 53 may be between the active region 23 and the plurality of channel layers 27 and between the plurality of channel layers 27 and may intersect the plurality of channel layers 27 on the plurality of channel layers 27. The gate electrode 53 may extend on the device isolation layer 29. A bottom surface of the gate electrode 53 may be at a lower level than the upper end of the active region 23. The gate electrode 53 may partially cover a side surface of the active region 23. In an implementation, at least a portion of the gate electrode 53 may be between channel layers 27 of the plurality of channel layers 27 or between the active region 23 and the plurality of channel layers 27.

The gate dielectric layer 51 may be between the gate electrode 53 and the plurality of channel layers 27 and between the gate electrode 53 and the active region 23, and may extend between the gate electrode 53 and the device isolation layer 29. The gate dielectric layer 51 may be between the gate electrode 53 and the plurality of inner spacers 43. The gate dielectric layer 51 may extend between the sidewall spacer 38 and the gate electrode 53 and between the sidewall spacer 38 and the gate capping pattern 55.

The pair of source/drain regions 45 may be on the active region 23 adjacent to or at sides (e.g., both sides) of the gate electrode 53. The pair of source/drain regions 45 may be in direct contact with the active region 23 and the plurality of channel layers 27. The pair of source/drain regions 45 may include a selective epitaxial growth (SEG) layer. The pair of source/drain regions 45 may include, e.g., silicon phosphide (SiP), silicon carbide (SiC), silicon (Si), or silicon germanium (SiGe). Each of the pair of source/drain regions 45 may have a vertical height (e.g., in a direction extending away from the substrate 21) that is greater than a lateral width thereof. Upper ends of the pair of source/drain regions 45 may be at a higher level than an upper end of the at least one channel layer 27. For example, the upper ends of the pair of source/drain regions 45 may be at a higher level than an upper end of an uppermost channel layer 27 of the plurality of channel layers 27.

The lateral width of each of the pair of source/drain regions 45 may be greater than (e.g., or equal to) a lateral width of the active region 23. The active region 23 may have a first (e.g., lateral) width W1 (in a first direction). A maximum width of each of the pair of source/drain regions 45 may be a second (e.g., lateral) width W2 (in the first direction). The second width W2 may be 1.3 times or less the first width W1 (e.g., but still greater than or equal to the first width W1). In an implementation, the second width W2 may be 1 to 1.3 times the first width W1. Each of the pair of source/drain regions 45 may have a box shape, rounded shape, or a circular shape. When the second width W2 is greater than or equal to the first width W1, electrical resistances between the pair of source/drain regions 45 and the plurality of channel layers 27 may be reduced. When the second width W2 is greater than or equal to the first width W1, electrical characteristics and reliability of the semiconductor device may be improved. When the second width W2 is 1.3 times or less the first width W1, leakage currents of the pair of source/drain regions 45 may be reduced. When the second width W2 is 1.3 times or less the first width W1, integration density of the semiconductor device may be increased. When the second width W2 is 1 to 1.3 times the first width W1, the semiconductor device that may help minimize a leakage current, may be advantageous for an increase in integration density, and may have excellent electrical characteristics.

The plurality of inner spacers 43 may be between the gate electrode 53 and the pair of source/drain regions 45. The plurality of inner spacers 43 may be between channel layers 27 of the plurality of channel layers 27. The plurality of inner spacers 43 may be between a lowermost channel layer 27 of the plurality of channel layers 27 and the active region 23.

The interlayer insulating layer 47 may be on the device isolation layer 29 to cover the pair of source/drain regions 45. The interlayer insulating layer 47 may cover side surfaces of the pair of source/drain regions 45. The gate capping pattern 55 may cover the gate electrode 53.

The sidewall spacer 38 may be between the interlayer insulating layer 47 and the gate electrode 53 and between the interlayer insulating layer 47 and the gate capping pattern 55. The sidewall spacer 38 may be on the plurality of channel layers 27. The sidewall spacer 38 may be in direct contact with a top surface of the uppermost channel layer 27 of the plurality of channel layers 27. The sidewall spacer 38 may be partially retained on the side surface of the active region 23. Upper ends of the interlayer insulating layer 47, the sidewall spacer 38, and the gate capping pattern 55 may be substantially coplanar with each other.

In an implementation, the active region 23 and the plurality of channel layers 27 may include P-type impurities. The pair of source/drain regions 45 may include N-type impurities. The pair of source/drain regions 45 may include an SEG layer having silicon (Si) and phosphorus (P).

In an implementation, the active region 23 and the plurality of channel layers 27 may include N-type impurities. The pair of source/drain regions 45 may include P-type impurities. The pair of source/drain regions 45 may include an SEG layer having silicon (Si), germanium (Ge), and boron (B).

Figure 3:
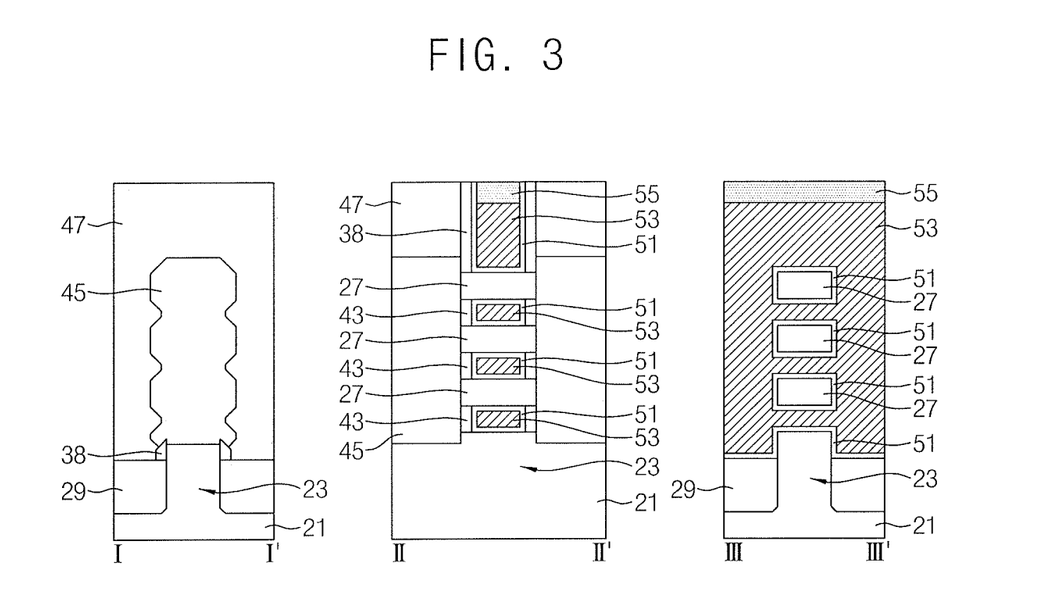
FIGS. 3 to 6 illustrate cross-sectional views of a semiconductor device according to an embodiment.
Figure 4:
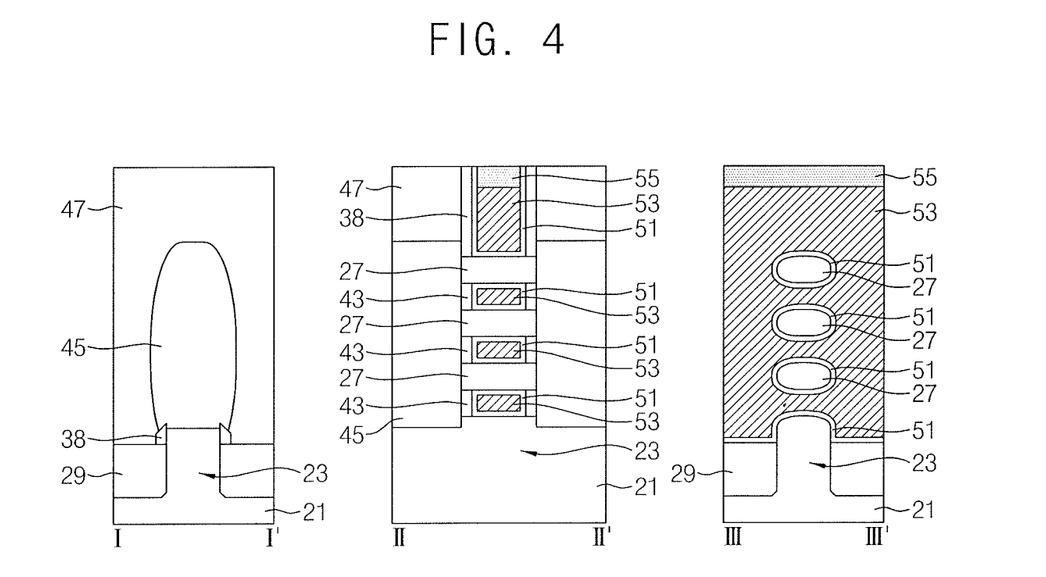
Figure 5:
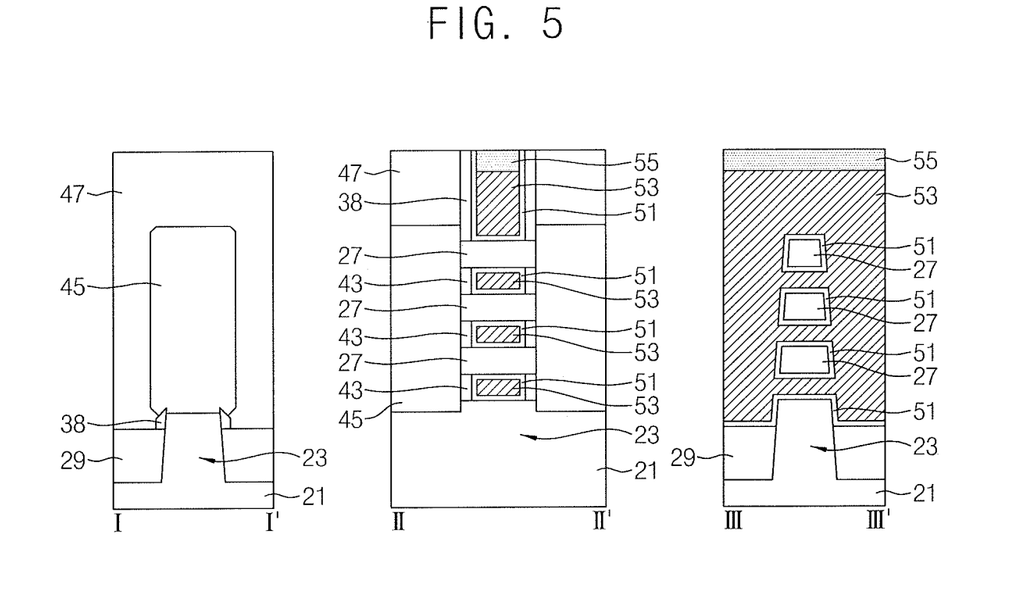

FIGS. 3 to 6 illustrate cross-sectional views of a semiconductor device according to an embodiment. FIGS. 3 to 5 illustrate cross-sectional views taken along lines I-I', II-II', and III-III' of FIG. 2.

Referring to FIG. 3, a plurality of inner spacers 43 may inhibit excessive lateral growth of an SEG layer. A shape of a pair of source/drain regions 45 may depend on a height of each of the plurality of inner spacers 43 and a thickness of each of a plurality of channel layers 27. The pair of source/drain regions 45 may obtain a desired size and shape by controlling sizes of an active region 23, the plurality of channel layers 27, and the plurality of inner spacers 43 and distances among the active region 23, the plurality of channel layers 27, and the plurality of inner spacers 43. Side surfaces of the pair of source/drain regions 45 may have a plurality of rough or uneven portions. Portions of the pair of source/drain regions 45 adjacent to the plurality of channel layers 27 may protrude in a lateral direction as compared with or relative to portions of the pair of source/drain regions 45 adjacent to the plurality of inner spacers 43. For example, the pair of source/drain regions 45 may have a corrugated shaped edge in cross section, in which a protruding part thereof is aligned with (e.g., at a same height with respect to) the plurality of channel layers 27 and a receded part thereof is aligned with the plurality of inner spacers 43.

Referring to FIG. 4, upper and lower corners of the plurality of channel layers 27 may be rounded. Upper corners of the active region 23 may be rounded. Each of the plurality of source/drain regions 45 may have a circular shape.

Referring to FIG. 5, a width of the channel layers 27 of plurality of channel layers 27 may become smaller in an upward direction (e.g., in the direction away from the substrate 21). A width of the active region 23 may become larger (e.g., increase) in a downward direction.

Figure 6:
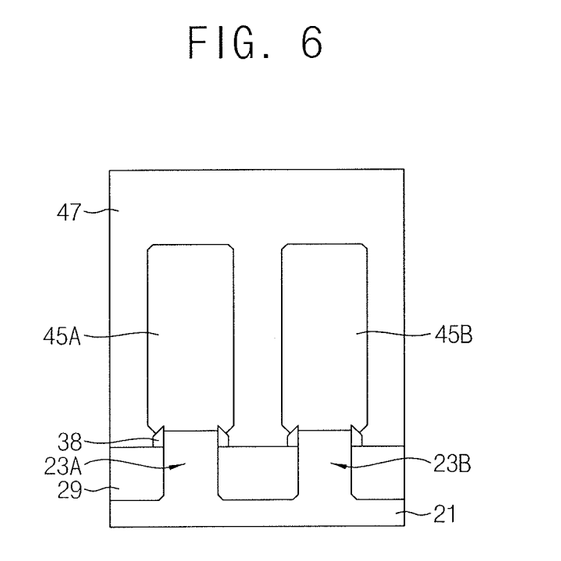

Referring to FIG. 6, the device isolation layer 29 may be in the substrate 21 and may define first and second active regions 23A and 23B, which are spaced apart from each other. The device isolation layer 29 may be between the first and second active regions 23A and 23B and outside the first and second active regions 23A and 23B in the substrate 21. The first and second active regions 23A and 23B may be parallel to each other. First and second source/drain regions 45A and 45B may be on the first and second active regions 23A and 23B and spaced apart from each other. The first and second source/drain regions 45A and 45B may include an SEG layer. A maximum width of each of the first and second source/drain regions 45A and 45B may be 1.3 times or less a width of a corresponding (e.g., underlying) one of the first and second active regions 23A and 23B. In an implementation, the maximum width of each of the first and second source/drain regions 45A and 45B may be 1 to 1.3 times the width of the corresponding one of the first and second active regions 23A and 23B. Each of the first and second source/ drain regions 45A and 45B may have a box shape or a circular shape. In an implementation, the first and second source/drain regions 45A and 45B may include SiP. An interlayer insulating layer 47 may be on the device isolation layer 29 to cover the first and second source/drain regions 45A and 45B.

The interlayer insulating layer 47 may be between the first and second source/drain regions 45A and 45B and outside the first and second source/drain regions 45A and 45B. The first source/drain region 45A may be electrically insulated from the second source/drain region 45B. A leakage current between the first and second source/drain regions 45A and 45B may be minimized.

FIGS. 7 to 19 illustrate cross-sectional views of stages in a method of forming a semiconductor device according to an embodiment.

Figure 7:
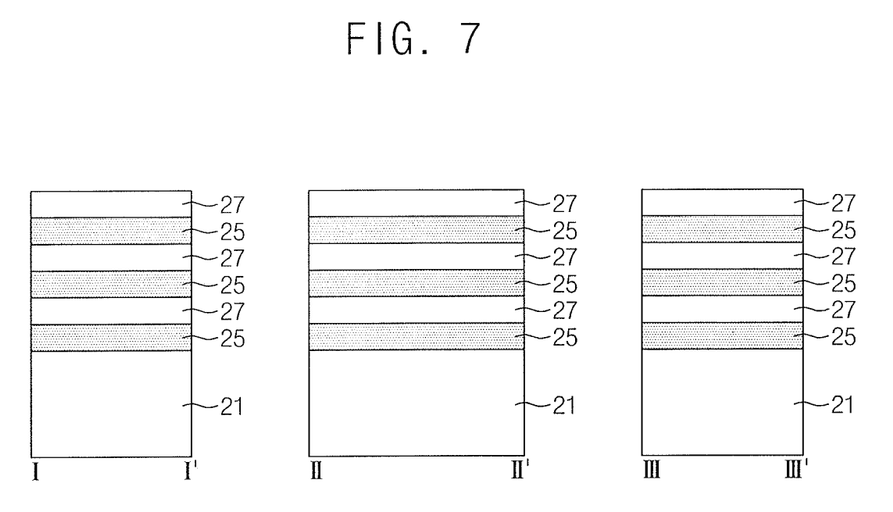
FIGS. 7 to 20 illustrate cross-sectional views of stages in a method of forming a semiconductor device according to an embodiment.

Referring to FIG. 7, a plurality of sacrificial layers 25 and a plurality of channel layers 27 may be alternately and repeatedly formed on a substrate 21.

The substrate 21 may be a semiconductor substrate, such as a silicon wafer or a silicon-on-insulator (SOI) wafer. The substrate 21 may include a P-well having P-type impurities, an N-well having N-type impurities, or a combination thereof, but descriptions thereof will be omitted for brevity. The P-type impurities may include boron (B), and the N-type impurities may include phosphorus (P), arsenic (As), or a combination thereof. In an implementation, the substrate 21 may be a single crystalline wafer having P-type impurities.

The plurality of sacrificial layers 25 may include a material having an etch selectivity with respect to the plurality of channel layers 27 and the substrate 21. In an implementation, each of the plurality of sacrificial layers 25 may include a SiGe layer formed using an SEG process, and each of the plurality of channel layers 27 may include a Si layer formed using an SEG process. Each of the plurality of channel layers 27 may include P-type impurities or N-type impurities. In an implementation, each of the plurality of channel layers 27 may include P-type impurities.

Figure 8:
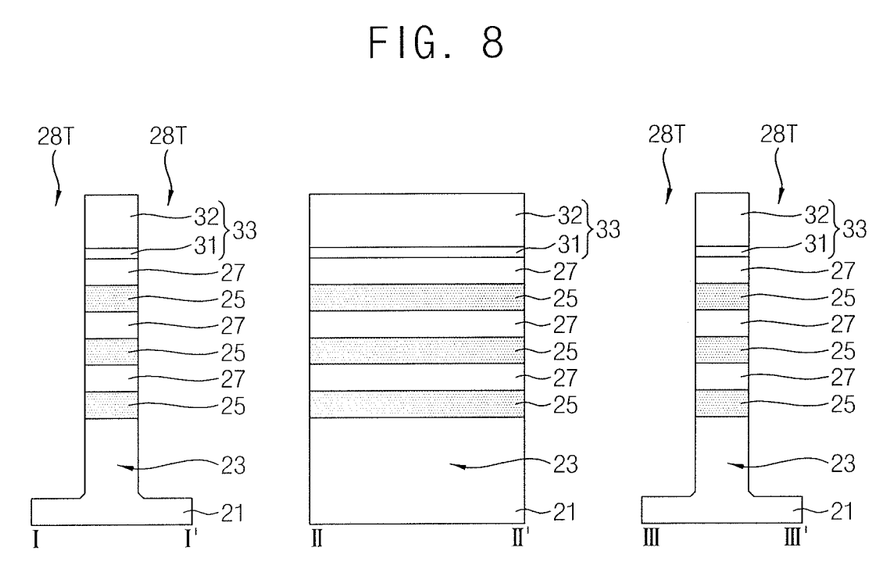

Referring to FIG. 8, a first mask pattern 33 may be formed on an uppermost channel layer of the plurality of channel layers 27. The first mask pattern 33 may include a first buffer layer 31 and a first mask layer 32. The plurality of channel layers 27, the plurality of sacrificial layers 25, and the substrate 21 may be partially removed using the first mask pattern 33 as an etch mask, thereby forming a plurality of trenches 28T.

An active region 23 may be defined in the substrate 21 between the plurality of trenches 28T. The plurality of sacrificial layers 25 and the plurality of channel layers 27 may be retained on the active region 23 between the plurality of trenches 28T.

The first buffer layer 31 may be formed between the uppermost channel layer of the plurality of channel layers 27 and the first mask layer 32. The first buffer layer 31 may be in direct contact with the uppermost channel layer of the plurality of channel layers 27. The first mask layer 32 may be formed on the first buffer layer 31. In an implementation, the first buffer layer 31 may include silicon oxide, and the first mask layer 32 may include silicon nitride.

The formation of the plurality of trenches 28T may include an anisotropic etching process. Bottoms of the plurality of trenches 28T may be formed at a lower level than a top surface of the substrate 21. Side surfaces of the active region 23, the plurality of sacrificial layers 25, and the plurality of channel layers 27 may be exposed at sidewalls of the plurality of trenches 28T.

Figure 9:
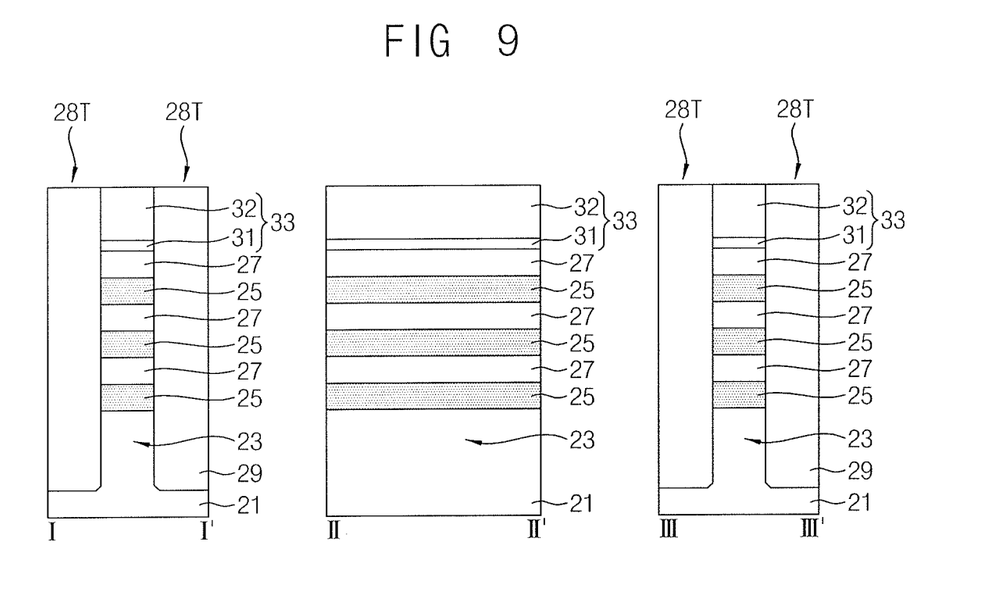

Referring to FIG. 9, a device isolation layer 29 may be formed inside the plurality of trenches 28T. The device isolation layer 29 may include an insulating material such as silicon oxide, silicon nitride, silicon oxynitride, or a combination thereof.

Figure 10:
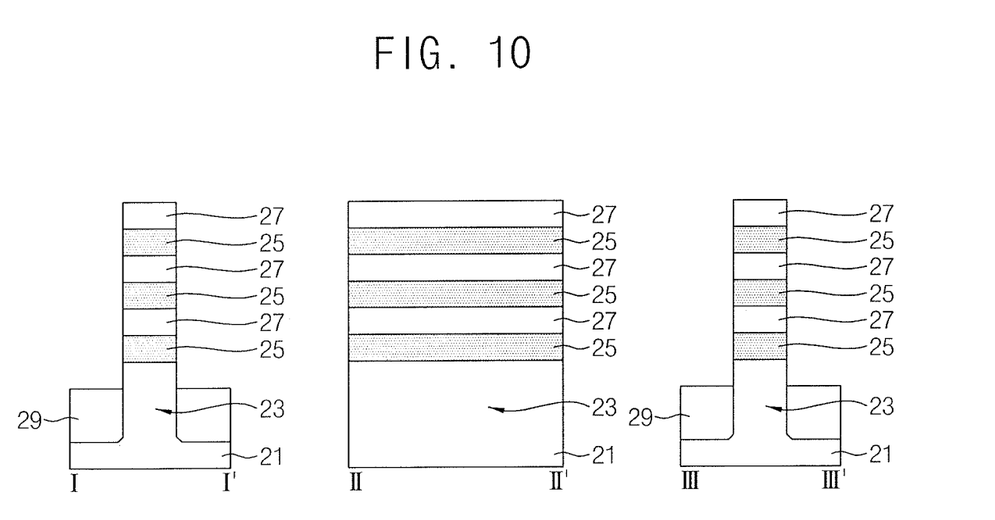

Referring to FIG. 10, the device isolation layer 29 may be partially etched and the first mask pattern 33 may be removed to expose the plurality of sacrificial layers 25 and the plurality of channel layers 27. Side surfaces of the active region 23 may also be partially exposed. A top surface of the device isolation layer 29 may be formed at a lower level than a top surface of the active region 23.

Figure 11:
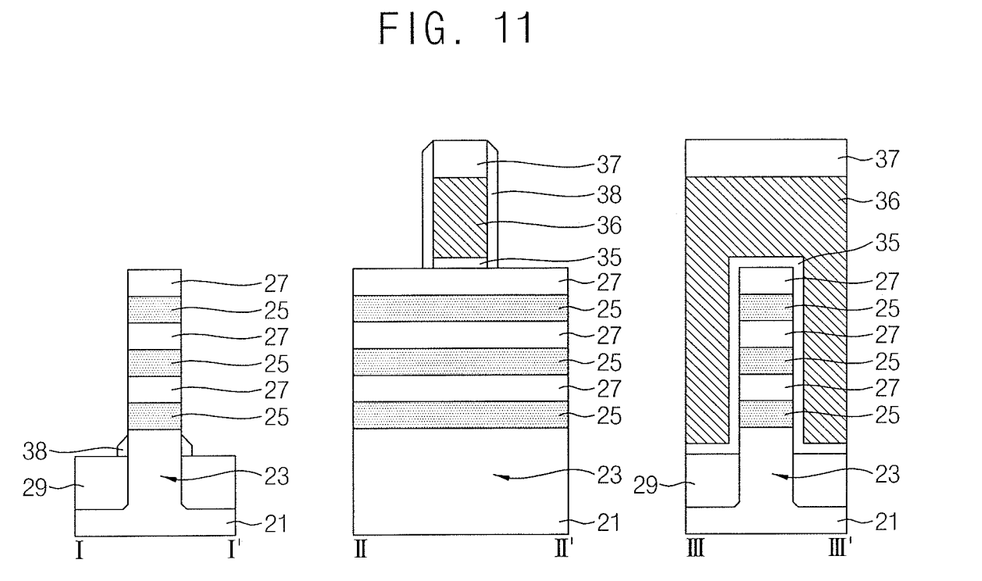

Referring to FIG. 11, a second buffer layer 35, a temporary gate electrode 36, a second mask pattern 37, and sidewall spacers 38 may be formed.

The formation of the second buffer layer 35 and the temporary gate electrode 36 may include a plurality of thin-film forming processes and a plurality of patterning processes. The second buffer layer 35 may include an oxide such as silicon oxide. The temporary gate electrode 36 may include polysilicon. The temporary gate electrode 36 may intersect the plurality of sacrificial layers 25 and the plurality of channel layers 27 and extend on the device isolation layer 29. The temporary gate electrode 36 may partially cover top surfaces and side surfaces of the plurality of channel layers 27, partially cover side surfaces of the plurality of sacrificial layers 25, partially cover the side surfaces of the active region 23, and partially cover the device isolation layer 29. The second buffer layer 35 may be formed between the temporary gate electrode 36 and the plurality of channel layers 27, between the temporary gate electrode 36 and the plurality of sacrificial layers 25, between the temporary gate electrode 36 and the active region 23, and between the temporary gate electrode 36 and the device isolation layer 29. The second mask pattern 37 may be formed on the temporary gate electrode 36. The second mask pattern 37 may include a nitride such as silicon nitride.

The formation of the sidewall spacers 38 may include a thin-film forming process and an anisotropic etching process. The sidewall spacers 38 may include a nitride, such as silicon nitride. The sidewall spacers 38 may cover side surfaces of the second buffer layer 35 and side surfaces of the temporary gate electrode 36 and extend on side surfaces of the second mask pattern 37. The sidewall spacers 38 may partially cover the side surfaces of the active region 23.

Figure 12:
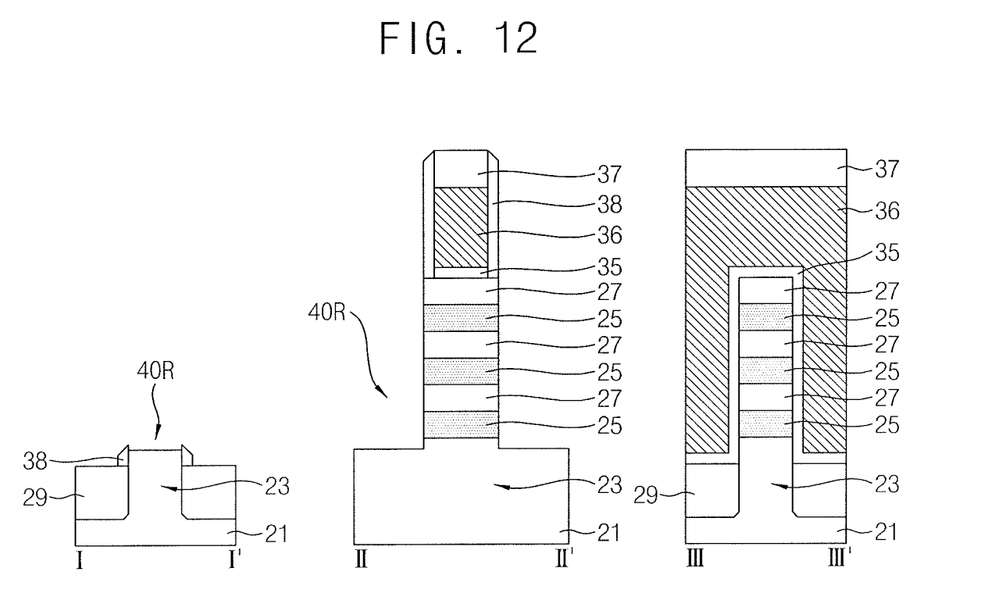

Referring to FIG. 12, the plurality of channel layers 27, the plurality of sacrificial layers 25, and the active region 23 may be partially removed using the second mask pattern 37 and the sidewall spacers 38 as etch masks to form a recess region 40R. A bottom of the recess region 40R may be at a lower level than an upper end of the active region 23. The side surfaces of the plurality of channel layers 27 and the side surfaces of the plurality of sacrificial layers 25 may be exposed inside the recess region 40R. The active region 23 may be exposed at the bottom of the recess region 40R.

Figure 13:
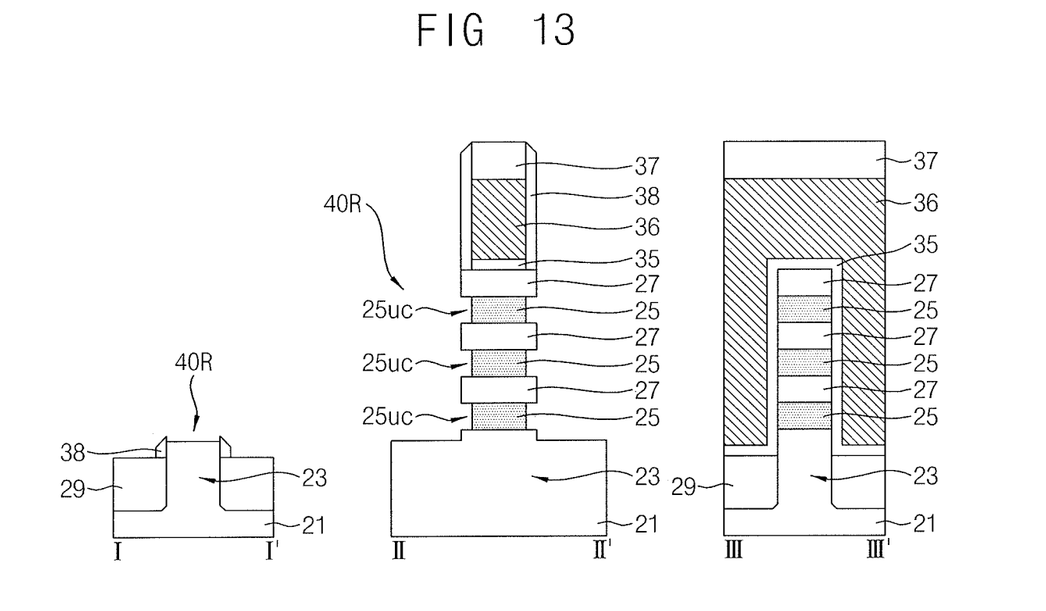

Referring to FIG. 13, the plurality of sacrificial layers 25 may be partially etched to form a plurality of undercut regions 25UC. The formation of the plurality of undercut regions 25UC may include an isotropic etching process.

Figure 14:
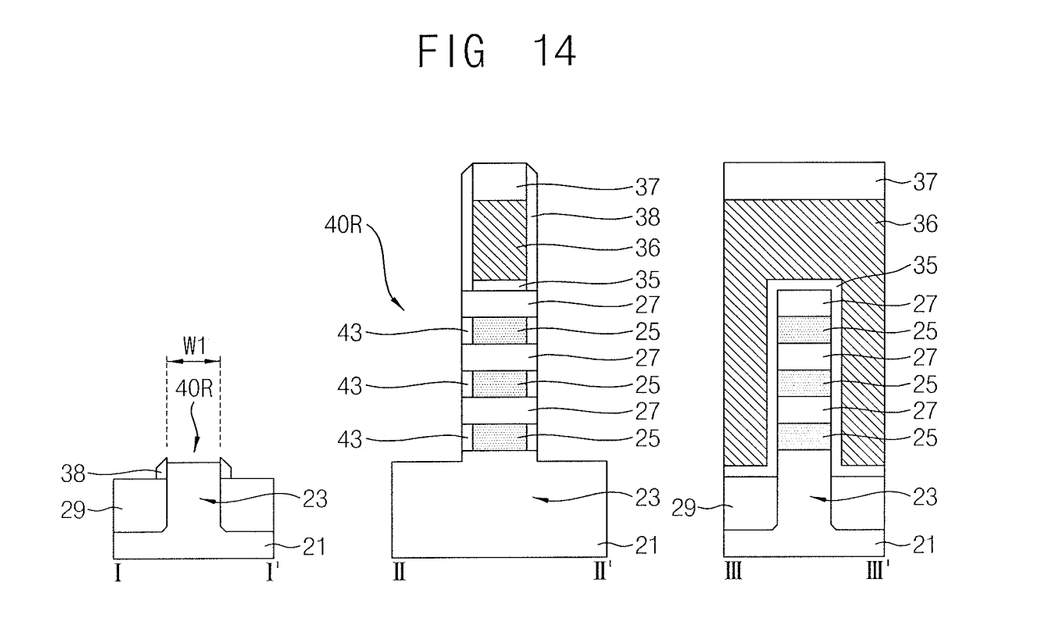

Referring to FIG. 14, a plurality of inner spacers 43 may be formed in the plurality of undercut regions 25UC. The formation of the plurality of inner spacers 43 may include a thin-film forming process and an anisotropic etching process. The plurality of inner spacers 43 may include a nitride such as silicon nitride. The active region 23 may have a first width W1.

Figure 15:
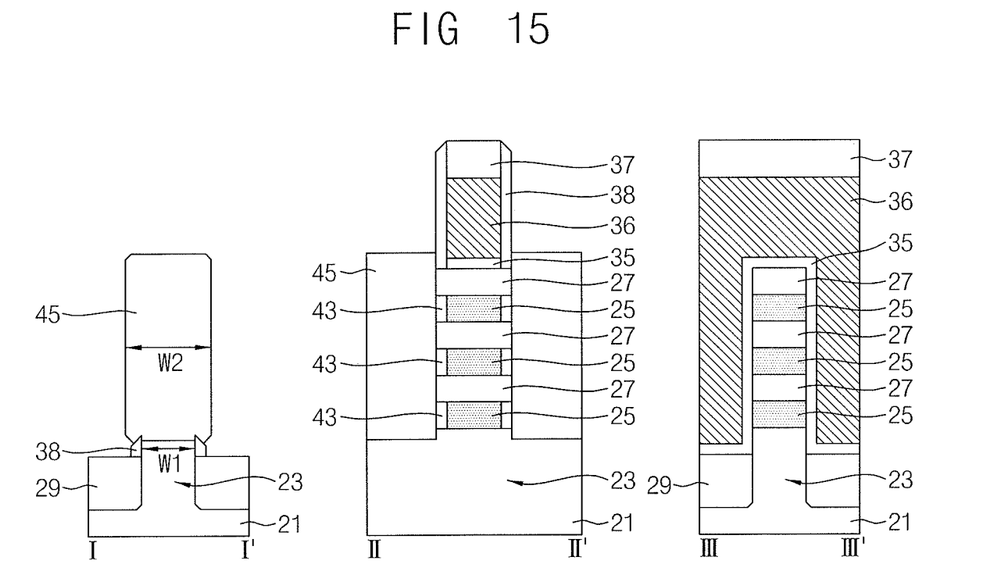

Referring to FIG. 15, a pair of source/drain regions 45 may be formed on the active region 23. The pair of source/drain regions 45 may include an SEG layer formed using an SEG process. The pair of source/drain regions 45 may include impurities of a different conductivity type from the plurality of channel layers 27. The pair of source/drain regions 45 may include P-type impurities or N-type impurities. The pair of source/drain regions 45 may include SiP, SiC, Si, or SiGe.

Each of the pair of source/drain regions 45 may be formed to have various shapes similar to those described with reference to FIGS. 1 to 6. Each of the pair of source/drain regions 45 may have a box shape or a circular shape. In an implementation, during the process of forming the pair of source/drain regions 45 using the SEG process, the formation of the SEG layer may be comparatively facilitated on surfaces of the active region 23 and the plurality of channel layers 27, while the formation of the SEG layer may be comparatively inhibited on surfaces of the plurality of inner spacers 43.

During the formation of the pair of source/drain regions 45, the plurality of inner spacers 43 may inhibit excessive lateral growth of the SEG layer. A shape of the pair of source/drain regions 45 may depend on a height of each of the plurality of inner spacers 43 and a thickness of each of the plurality of channel layers 27. The pair of source/drain regions 45 may obtain a desired size and shape by controlling sizes of the active region 23, the plurality of channel layers 27, and the plurality of inner spacers 43 and distances among the active region 23, the plurality of channel layers 27, and the plurality of inner spacers 43. Each of the pair of source/drain regions 45 may have a second width W2. The second width W2 may be 1.3 times or less the first width W1. In an embodiment, the second width W2 may be greater than the first width W1. The second width W2 may be 1 to 1.3 times the first width W1.

In an implementation, a height of each of the plurality of inner spacers 43 may be 0.8 times or more a thickness of an adjacent one of the plurality of channel layers 27. In an implementation, the height of each of the plurality of inner spacers 43 may be 0.8 to 5 times the thickness of the adjacent one of the plurality of channel layers 27. In an implementation, the height of each of the plurality of inner spacers 43 may be about equal to the thickness of the adjacent one of the plurality of channel layers 27.

In an implementation, the active region 23 and the plurality of channel layers 27 may include P-type impurities. The pair of source/drain regions 45 may include a SiP layer, a SiC layer containing N-type impurities, or a Si layer containing N-type impurities. For example, each of the pair of source/drain regions 45 may include a SiP layer formed using an SEG process.

In an implementation, the active region 23 and the plurality of channel layers 27 may include N-type impurities. The pair of source/drain regions 45 may include a SiGe layer containing P-type impurities or a Si layer containing P-type impurities. For instance, each of the pair of source/drain regions 45 may include a boron (B)-doped SiGe layer formed using an SEG process.

According to embodiments, excessive lateral growth of the pair of source/drain regions 45 may be inhibited, and the pair of source/drain regions 45 may obtain a desired shape. A leakage current may be minimized due to the desired shape of the pair of source/drain regions 45, and a semiconductor device that is advantageous for an increase in integration density and has excellent operating characteristics may be implemented.

Figure 16:
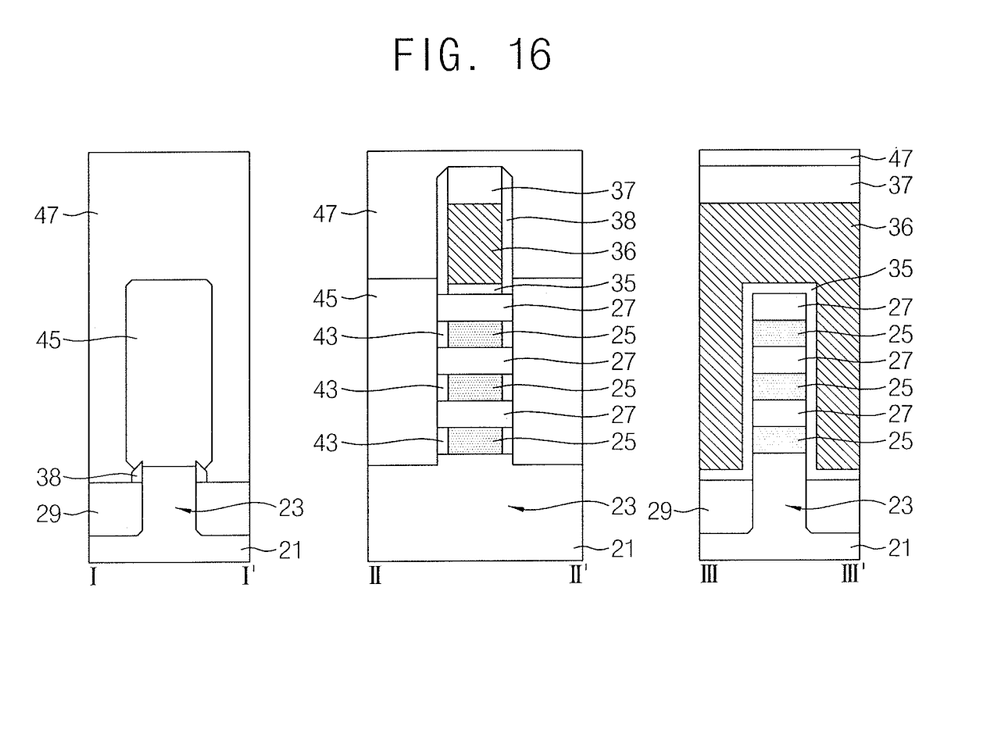

Referring to FIG. 16, an interlayer insulating layer 47 may be formed to cover the pair of source/drain regions 45, the second mask pattern 37, and the sidewall spacers 38. The interlayer insulating layer 47 may include silicon oxide, silicon nitride, silicon oxynitride, silicon oxycarbonitride (SiOCN), a low-k dielectric material, a high-k dielectric material, or a combination thereof. The interlayer insulating layer 47 may include a multi-layer including a plurality of different layers.

Figure 17:
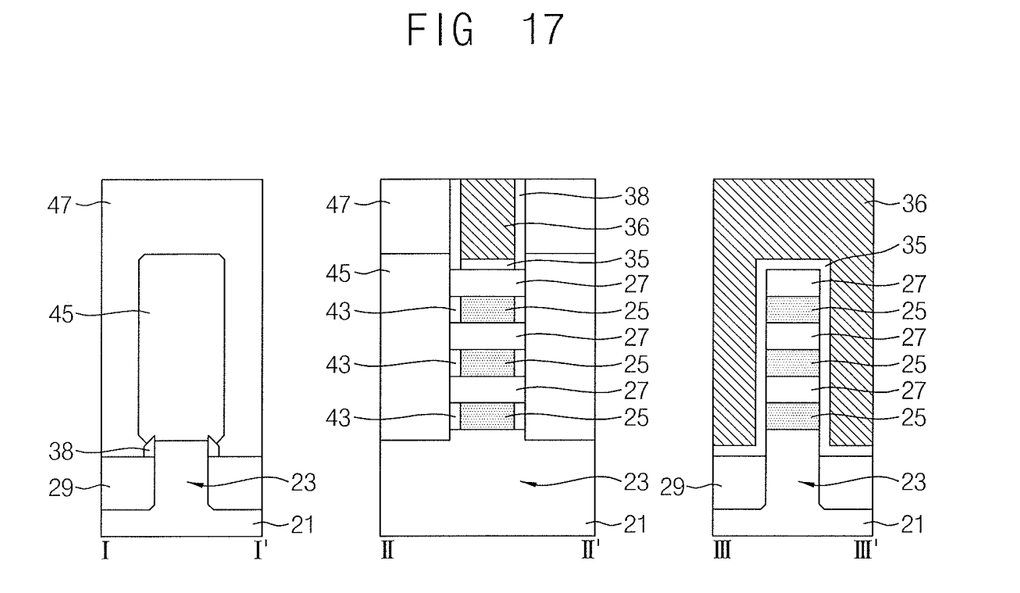

Referring to FIG. 17, the interlayer insulating layer 47 may be partially removed, and the second mask pattern 37 may be removed to expose the temporary gate electrode 36. The process of exposing the temporary gate electrode 36 may include a planarization process. The planarization process may include a chemical mechanical polishing (CMP) process, an etchback process, or a combination thereof. Top surfaces of the interlayer insulating layer 47, the sidewall spacers 38, and the temporary gate electrode 36 may be exposed and substantially coplanar with each other.

Figure 18:
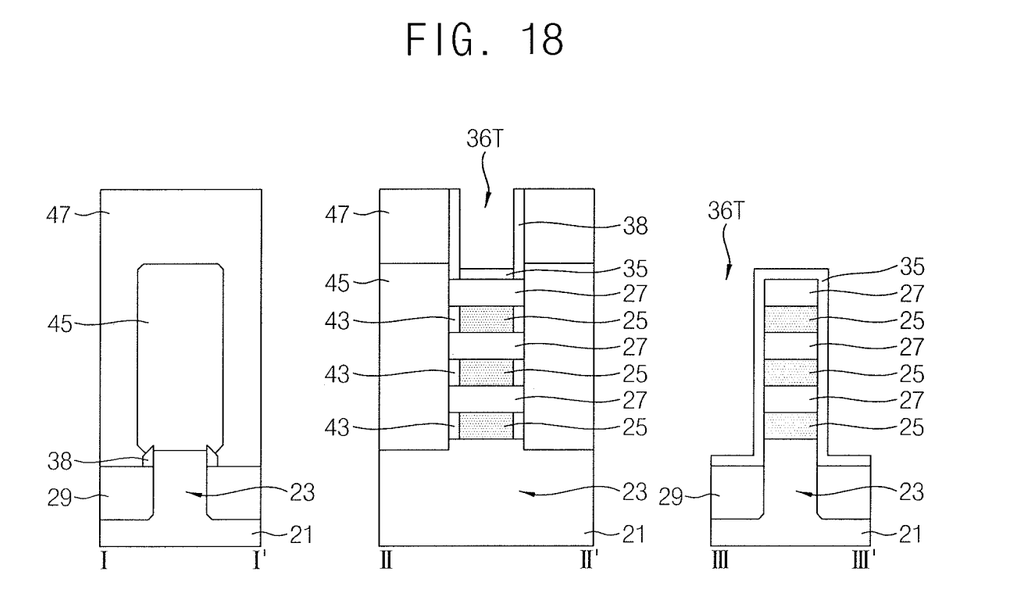

Referring to FIG. 18, the temporary gate electrode 36 may be removed to form a gate trench 36T. The formation of the gate trench 36T may include an isotropic etching process.

Figure 19:
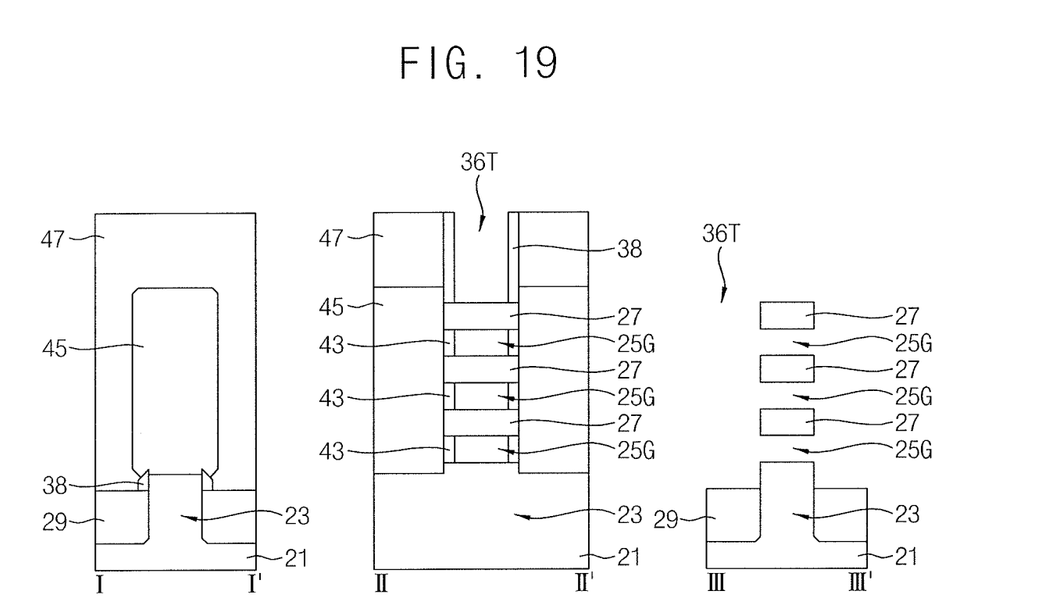

Referring to FIG. 19, the second buffer layer 35 may be removed, and the plurality of sacrificial layers 25 may be removed to form a plurality of gap regions 25G.

Referring again to FIG. 1, a gate dielectric layer 51, a gate electrode 53, and a gate capping pattern 55 may be formed. The formation of the gate dielectric layer 51, the gate electrode 53, and the gate capping pattern 55 may include a plurality of thin-film forming processes and a plurality of planarization processes.

The gate electrode 53 may be formed inside the gate trench 36T and the plurality of gap regions 25G. The gate electrode 53 may intersect the active region 23 and the plurality of channel layers 27 on the active region 23 and the plurality of channel layers 27. The pair of source/drain regions 45 may be retained adjacent to both sides of the gate electrode 53.

The gate electrode 53 may include a metal, a metal nitride, a metal oxide, a metal silicide, conductive carbon, polysilicon or a combination thereof. The gate electrode 53 may include tungsten (W), tungsten nitride (WN), titanium (Ti), titanium nitride (TiN), titanium silicon nitride (TiSiN), tantalum (Ta), tantalum nitride (TaN), tantalum silicon nitride (TaSiN), zirconium (Zr), zirconium nitride (ZrN), aluminum (Al), aluminum nitride (AlN), ruthenium (Ru), ruthenium nitride (RuN), molybdenum (Mo), molybdenum nitride (MoN), molybdenum silicon nitride (MoSiN), cobalt (Co), cobalt nitride (CoN), cobalt silicon nitride (CoSiN), nickel (Ni), silicon (Si), or a combination thereof. The gate electrode 53 may include an NMOS work function metal or a PMOS work function metal. The gate electrode 53 may be referred to as a replacement metal gate (RMG).

The gate dielectric layer 51 may be formed between the gate electrode 53 and the active region 23 and between the gate electrode 53 and the plurality of channel layers 27. The gate dielectric layer 51 may extend between the gate electrode 53 and the sidewall spacers 38 and between the gate electrode 53 and the device isolation layer 29. An interfacial dielectric layer (e.g., a silicon oxide layer formed using a cleaning process) may be further formed on surfaces of the active region 23 and the plurality of channel layers 27. The gate dielectric layer 51 may include a high-k dielectric material, silicon oxide, silicon nitride, silicon oxynitride, or a combination thereof. For example, the gate dielectric layer 51 may include hafnium oxide (HfO), hafnium silicon oxide (HfSiO), aluminum oxide (AlO), or a combination thereof.

Each of the plurality of channel layers 27 may be surrounded by the gate electrode 53. The gate dielectric layer 51 may be between the plurality of channel layers 27 and the gate electrode 53. Each of the plurality of channel layers 27 may be surrounded by the gate dielectric layer 51.

The gate capping pattern 55 may cover the gate electrode 53. Top surfaces of the interlayer insulating layer 47, the sidewall spacers 38, and the gate capping pattern 55 may be exposed and be substantially coplanar with each other. The gate capping pattern 55 may include a nitride, such as silicon nitride.

Figure 20:
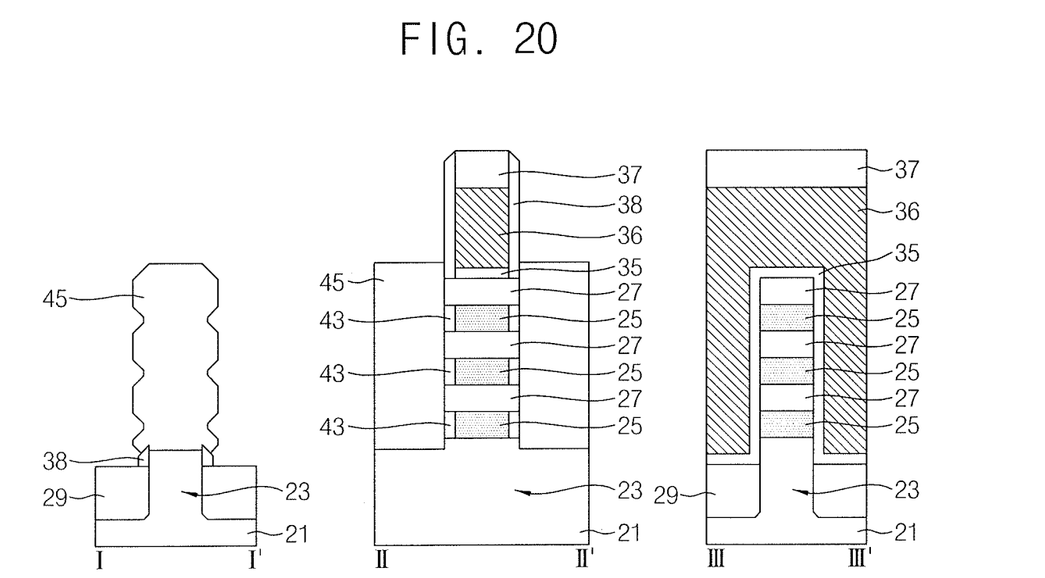

FIG. 20 illustrates a cross-sectional view of a stage in a method of forming a semiconductor device according to an embodiment.

Referring to FIG. 20, during a process of forming a pair of source/drain regions 45 using an SEG process, the formation of an SEG layer may be comparatively facilitated on surfaces of an active region 23 and a plurality of channel layers 27, while the formation of the SEG layer may be comparatively inhibited on surfaces of a plurality of inner spacers 43. During the formation of the pair of source/drain regions 45, the plurality of inner spacers 43 may inhibit excessive lateral growth of the SEG layer. A shape of the pair of source/drain regions 45 may depend on a height of each of the plurality of inner spacers 43 and a thickness of each of the plurality of channel layers 27.

The pair of source/drain regions 45 may obtain a desired size and shape by controlling sizes of the active region 23, the plurality of channel layers 27, and the plurality of inner spacers 43 and distances among the active region 23, the plurality of channel layers 27, and the plurality of inner spacers 43. In an implementation, a height of each of the plurality of inner spacers 43 may be 0.8 to 5 times a thickness of an adjacent one of the plurality of channel layers 27. Side surfaces of the pair of source/drain regions 45 may include a plurality of rough portions. Portions of the pair of source/drain regions 45 adjacent to the plurality of channel layers 27 may protrude in a lateral direction as compared with portions of the pair of source/drain regions 45 adjacent to the plurality of inner spacers 43.

Figure 21:
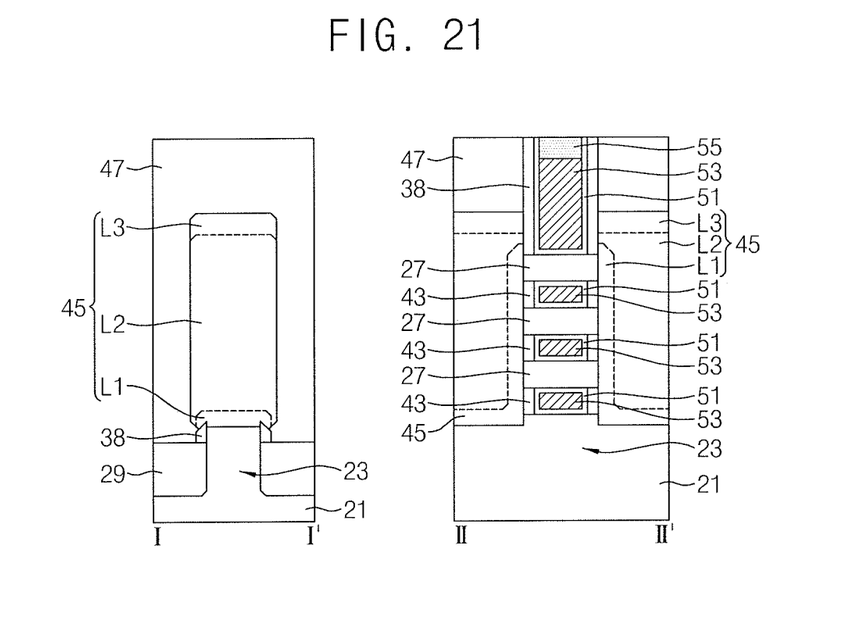
FIGS. 21 to 23 illustrate cross-sectional views of a semiconductor device according to an embodiment.
Figure 22:
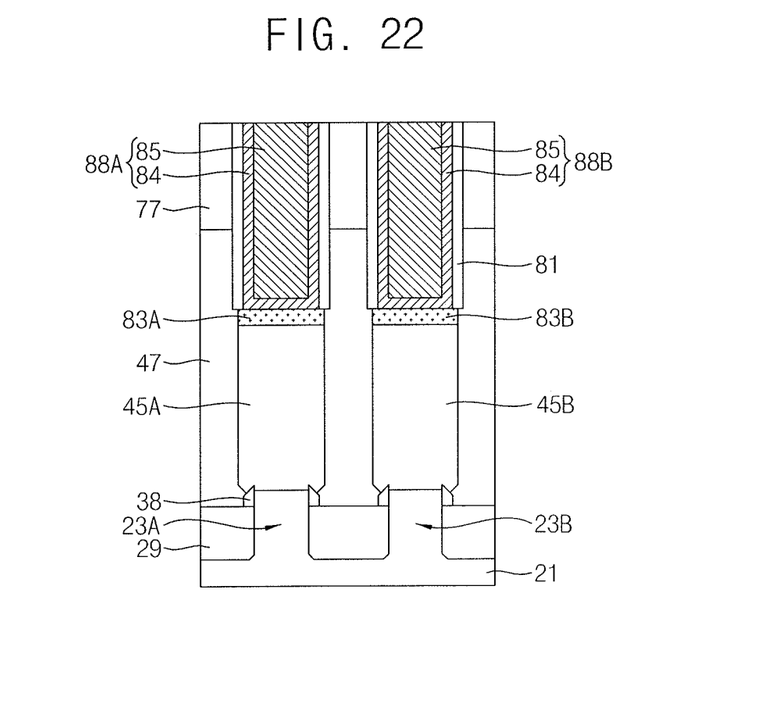
Figure 23:
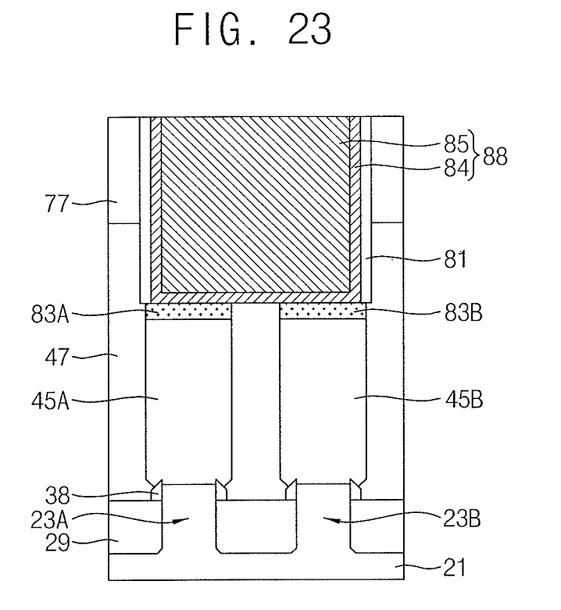

FIGS. 21 to 23 illustrate cross-sectional views of a semiconductor device according to an embodiment.

Referring to FIG. 21, each of a pair of source/drain regions 45 may include a first SEG layer L1, a second SEG layer L2, and a third SEG layer L3. The first SEG layer L1 may be formed on an active region 23 and in direct contact with at least one channel layer 27. The first SEG layer L1 may include a first percent by weight (wt %) of N-type impurities or a second percent by weight of P-type impurities. The first SEG layer L1 may include impurities of a different conductivity type from the at least one channel layer 27 and the active region 23. The second SEG layer L2 may be on the first SEG layer L1. The second SEG layer L2 may include a third percent by weight of N-type impurities or a fourth percent by weight of P-type impurities. In an implementation, the third percent by weight may be higher than the first percent by weight, and the fourth percent by weight may be higher than the second percent by weight. The second SEG layer L2 may include impurities of the same conductivity type as the first SEG layer L1.

The third SEG layer L3 may be on the second SEG layer L2. The third SEG layer L3 may include a fifth percent by weight of N-type impurities or a sixth percent by weight of P-type impurities. The fifth percent by weight may be higher than the third percent by weight, and the sixth percent by weight may be higher than the fourth percent by weight. In an implementation, the fifth percent by weight may be lower than the third percent by weight, and the sixth percent by weight may be lower than the fourth percent by weight.

Referring to FIG. 22, an upper insulating layer 77 may be on an interlayer insulating layer 47 to cover first and second source/drain region 45A and 45B. A first contact plug 88A and a second contact plug 88B may pass through the upper insulating layer 77 and the interlayer insulating layer 47 and may be respectively connected to the first and second source/drain regions 45A and 45B. Contact spacers 81 may surround side surfaces of the first and second contact plugs 88A and 88B. A first metal silicide layer 83A and a second metal silicide layer 83B may be between the first and second contact plugs 88A and 88B and the first and second source/drain regions 45A and 45B. Each of the first and second contact plugs 88A and 88B may include a barrier metal layer 84 and a plug conductive layer 85.

The upper insulating layer 77 may include silicon oxide, silicon nitride, silicon oxynitride, silicon oxycarbonitride (SiOCN), a low-k dielectric material, a high-k dielectric material, or a combination thereof. The upper insulating layer 77 may be a multi-layer including a plurality of different layers. The contact spacers 81 may include a nitride, such as silicon nitride. The barrier metal layer 84 may surround a side surface and a bottom surface of the plug conductive layer 85. The barrier metal layer 84 may include Ti, TiN, Ta, TaN, or a combination thereof. The plug conductive layer 85 may include a metal, a metal nitride, a metal oxide, a metal silicide, conductive carbon, polysilicon or a combination thereof.

Referring to FIG. 23, a contact plug 88 may pass through the upper insulating layer 77 and the interlayer insulating layer 47 and may be connected to the first and second source/drain regions 45A and 45B. The contact plug 88 may include a barrier metal layer 84 and a plug conductive layer 85. Contact spacers 81 may surround side surfaces of the contact plug 88. A first metal silicide layer 83A and a second metal silicide layer 83B may be between the contact plug 88 and the first and second source/drain regions 45A and 45B.

By way of summation and review, lateral growth of the SEG layer could lead to an increase in leakage current between adjacent source/drain regions.

One or more embodiments may provide a new technique for improving electrical characteristics of a transistor while minimizing a leakage current.

According to the example embodiments, a pair of source/drain regions may be provided adjacent to both sides of a gate electrode on an active region. The pair of source/drain regions may be in contact with at least one channel layer. A maximum width of each of the pair of source/drain regions may be 1.3 times or less a width of the active region. A shape of each of the pair of source/drain regions may include a box shape or a circular shape. A semiconductor device, which may minimize a leakage current, may be advantageous for an increase in integration density, and may have excellent operating characteristics, may be implemented.

One or more embodiments may provide a semiconductor device, which may help minimize a leakage current and may have excellent operating characteristics, and a method of forming the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region defined in a substrate;
at least one channel layer on the active region;
a gate electrode intersecting the active region and on the active region and surrounding the at least one channel layer; and
a pair of source/drain regions adjacent to both sides of the gate electrode, on the active region, and in contact with the at least one channel layer,
wherein:
the pair of source/drain regions includes a selective epitaxial growth (SEG) layer, and
a maximum width of each of the pair of source/drain regions in a first direction is 1 to 1.3 times a width of the active region in the first direction.

2. The semiconductor device as claimed in claim 1, wherein each of the pair of source/drain regions has a box shape or a rounded shape.

3. The semiconductor device as claimed in claim 1, wherein the pair of source/drain regions include silicon phosphide (SiP), silicon carbide (SiC), silicon (Si), or silicon germanium (SiGe).

4. The semiconductor device as claimed in claim 1, wherein upper ends of the pair of source/drain regions are farther from the substrate than an upper end of the at least one channel layer.

5. The semiconductor device as claimed in claim 1, wherein:
the at least one channel layer includes a plurality of channel layers, and
at least a portion of the gate electrode is between the channel layers of the plurality of channel layers or between the active region and the plurality of channel layers.

6. The semiconductor device as claimed in claim 5, wherein the channel layers of the plurality of channel layers are spaced apart from each other and sequentially stacked on the active region in a vertical direction.

7. The semiconductor device as claimed in claim 5, further comprising a plurality of inner spacers between the gate electrode and the pair of source/drain regions,
wherein the plurality of inner spacers are between the channel layers of the plurality of channel layers and between a lowermost channel layer of the plurality of channel layers and the active region.

8. The semiconductor device as claimed in claim 7, wherein the plurality of inner spacers include silicon nitride.

9. The semiconductor device as claimed in claim 7, wherein:
side surfaces of the pair of source/drain regions include a plurality of uneven portions, and
portions of the pair of source/drain regions adjacent to the plurality of channel layers protrude in a lateral direction relative to portions of the pair of source/drain regions adjacent to the plurality of inner spacers.

10. The semiconductor device as claimed in claim 1, further comprising:
a device isolation layer in the substrate and defining the active region;
an interlayer insulating layer on the device isolation layer and covering the pair of source/drain regions; and
sidewall spacers between the interlayer insulating layer and the gate electrode and on the at least one channel layer.

11. The semiconductor device as claimed in claim 10, further comprising a gate dielectric layer between the gate electrode and the at least one channel layer and between the gate electrode and the active region.

12. The semiconductor device as claimed in claim 11, wherein the gate dielectric layer extends between the sidewall spacers and the gate electrode.

13. The semiconductor device as claimed in claim 1, wherein each of the pair of source/drain regions includes:
a first SEG layer in contact with the at least one channel layer and having a first percent by weight of N-type impurities or a second percent by weight of P-type impurities;
a second SEG layer on the first SEG layer and having a third percent by weight of N-type impurities or a fourth percent by weight of P-type impurities, the third percent by weight being higher than the first percent by weight, and the fourth percent by weight being higher than the second percent by weight; and
a third SEG layer on the second SEG layer.

14. The semiconductor device as claimed in claim 1, further comprising:
an upper insulating layer on the pair of source/drain regions; and
a contact plug connected to a selected one of the pair of source/drain regions through the upper insulating layer.

15. A semiconductor device, comprising:
an active region defined in a substrate;
at least one channel layer on the active region and having P-type impurities;
a gate electrode intersecting the active region on the active region and surrounding the at least one channel layer; and
a pair of source/drain regions adjacent to both sides of the gate electrode, on the active region, and in contact with the at least one channel layer,
wherein:
the pair of source/drain regions include a selective epitaxial growth (SEG) layer having N-type impurities, and
a maximum width of each of the pair of source/drain regions in a first direction is 1 to 1.3 times a width of the active region in the first direction.

16. The semiconductor device as claimed in claim 15, wherein the pair of source/drain regions include silicon (Si) and phosphorus (P).

17. A semiconductor device, comprising:
first and second active regions defined in a substrate and spaced apart from each other; and
first and second source/drain regions on the first and second active regions and spaced apart from each other,
wherein:
the first and second source/drain regions include a selective epitaxial growth (SEG) layer, and
a maximum width of each of the first and second source/drain regions in a first direction is 1 to 1.3 times a width of a corresponding one of the first and second active regions in the first direction.

18. The semiconductor device as claimed in claim 17, wherein the first active region is parallel to the second active region.

19. The semiconductor device as claimed in claim 17, further comprising a device isolation layer in the substrate and between the first and second active regions.

20. The semiconductor device as claimed in claim 19, further comprising an interlayer insulating layer on the device isolation layer and between the first and second source/drain regions.

* * * * *